United States Patent
Yanagisawa

(10) Patent No.: US 11,359,302 B2
(45) Date of Patent: Jun. 14, 2022

(54) SUSCEPTOR HAVING CF COATING

(71) Applicant: ASM IP Holding B.V., Almere (NL)

(72) Inventor: Ippei Yanagisawa, Sagamihara (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/126,275

(22) Filed: Dec. 18, 2020

(65) Prior Publication Data

US 2021/0108328 A1 Apr. 15, 2021

Related U.S. Application Data

(62) Division of application No. 16/150,380, filed on Oct. 3, 2018, now abandoned.

(51) Int. Cl.
C25D 11/24 (2006.01)
C25D 11/16 (2006.01)
H05B 6/10 (2006.01)
C25D 17/16 (2006.01)
C25D 21/12 (2006.01)

(52) U.S. Cl.
CPC ............ C25D 11/16 (2013.01); C25D 11/246 (2013.01); C25D 17/16 (2013.01); C25D 21/12 (2013.01); H05B 6/105 (2013.01)

(58) Field of Classification Search
None
See application file for complete search history.

(56) References Cited

U.S. PATENT DOCUMENTS

| 6,159,301 A * | 12/2000 | Sato ..................... C23C 16/4581 118/723 E |
| 9,605,736 B1 * | 3/2017 | Foshage ............... F16H 25/2252 |
| 2002/0033183 A1 * | 3/2002 | Sun ...................... C23C 16/4404 134/1.1 |
| 2006/0097220 A1 * | 5/2006 | Kim ....................... C09K 13/08 252/79.1 |
| 2017/0066011 A1 | 3/2017 | Kole et al. |

FOREIGN PATENT DOCUMENTS

JP 2010272614 A 12/2010

OTHER PUBLICATIONS

GPT MSDS Sheet for TEFLON; Dec. 15, 2016 (Year: 2016).*

* cited by examiner

*Primary Examiner* — Humera N. Sheikh
*Assistant Examiner* — Elizabeth D Ivey
(74) *Attorney, Agent, or Firm* — Studebaker & Brackett PC

(57) ABSTRACT

Examples of a susceptor for supporting a substrate includes a base metal formed of aluminum or a material containing aluminum, an anodized layer covering a surface of the base metal and having cracks therein, and a CF coating of polymer provided in the cracks such that the exposure of the base metal is avoided.

7 Claims, 6 Drawing Sheets

FIG. 10

| C-F COATING CONDITIONS | | |
|---|---|---|
| Deposition | DMDMOS [sccm] | 220 |
| | Dry gas (He or Ar) [sccm] | 120 |
| | Oxygen [sccm] | 0 |
| | Chamber pressure [Torr] | 3.5 |
| | Electrode gap [mm] | 28 |
| | Lower electrode temp [degC] | 400 |
| | Frequency power [W @27.12MHz] | 3000 |
| Cleaning | NF3 or C2F6 [slpm] | 1.25 |
| | Dry gas (He or Ar) [slpm] | 4.00 |
| | Oxygen [slpm] | 0 |
| | Noble gas partial pressure [%] | 76 |
| | Chamber pressure [Torr] | 1.8 |
| | Lower electrode temp [degC] | 400 |

US 11,359,302 B2

SUSCEPTOR HAVING CF COATING

CROSS-REFERENCE TO RELATED APPLICATIONS

This application is a Divisional of U.S. patent application Ser. No. 16/150,380 filed Oct. 3, 2018, the entire content of which is incorporated herein by reference.

TECHNICAL FIELD

Examples are described which relate to a susceptor and a susceptor coating method.

BACKGROUND

A susceptor for supporting a substrate includes a base metal and an anodized layer covering the base metal. The base metal may be formed of aluminum or a material containing aluminum. The anodized layer is a layer formed by anodizing the base metal. There is a case where the base metal is exposed due to cracks occurring in the anodized layer.

When the exposed base metal is exposed to cleaning gas, gas containing aluminum may be generated. At this time, the gas containing aluminum may cause generation of foreign matters containing aluminum on a substrate as a processing target to be subjected to a plasma treatment. For example, the base metal is exposed to cleaning gas containing F to generate AlF, and the thus-generated AlF gasifies. The gasifying AlF serves as a particle source during the plasma treatment of the substrate. As an example, Al and SiOC chemically react with each other, whereby a film of AlOC may be formed on the substrate. Also, AlOC may remain as a contamination source in a chamber.

SUMMARY

Some examples described herein may address the above-described problems. Some examples described herein may provide a susceptor and a susceptor coating method that can enhance the quality of substrate processing.

In some examples, a susceptor includes a base metal formed of aluminum or a material containing aluminum, an anodized layer covering a surface of the base metal and having cracks therein, and a CF coating of polymer provided in the cracks.

BRIEF DESCRIPTION OF THE DRAWINGS

FIG. 10 is a table showing an example of a processing condition.

DETAILED DESCRIPTION

A susceptor and a susceptor coating method will be described with reference to the drawings. The same or corresponding constituent elements are represented by the same reference signs, and duplicative description thereof may be omitted.

Figure 1:
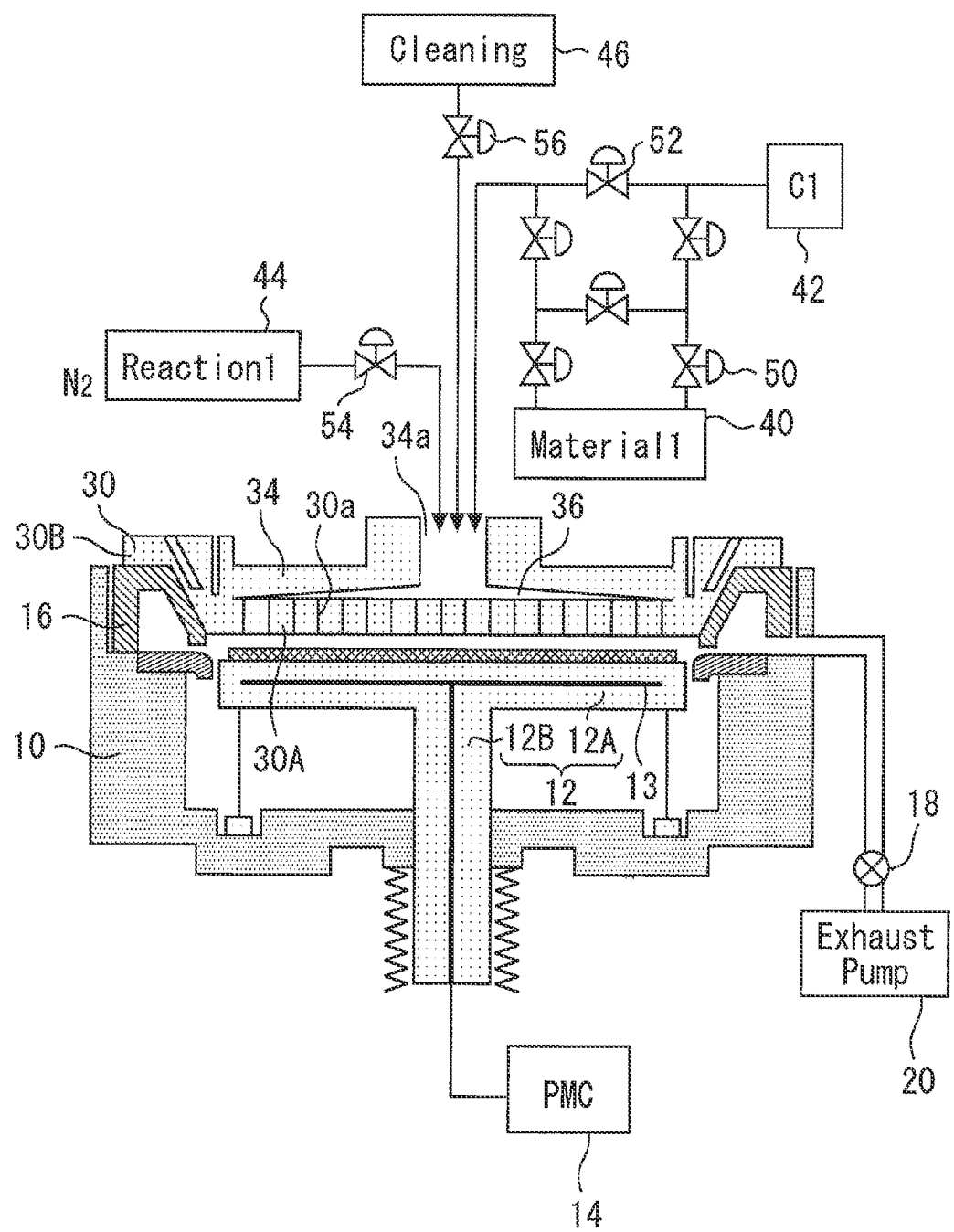
FIG. 1 is a diagram showing an example of a substrate processing apparatus.

FIG. 1 is a diagram showing a configuration example of a substrate processing apparatus. This substrate processing apparatus can be provided, for example, as a PECVD apparatus. The substrate processing apparatus may or may not contain a gas supply system. A susceptor 12 is provided in a chamber 10. The susceptor 12 includes a substrate supporting portion 12A, and a support pole 12B for supporting the substrate supporting portion 12A. A substrate as a processing target can be placed on the susceptor 12. The substrate is, for example, a Si wafer. A heater 13 for heating the susceptor may be provided inside the susceptor 12. A parallel plate electrode is provided by the susceptor 12 and a showerhead 30 provided thereon. By providing the susceptor 12 and the showerhead 30 as the parallel plate electrode, capacitive coupling plasma (CCP) may be generated mainly between the susceptor 12 and the showerhead 30. For example, the susceptor 12 is grounded, and high frequency power is applied to the showerhead 30.

The showerhead 30 includes a gas passing portion 30A provided so as to face the susceptor 12, and an encircling portion 30B for encircling the gas passing portion 30A. Plural through-holes 30a for allowing drift of gas therethrough are formed in the gas passing portion 30A. Various kinds of gases are provided onto a substrate 14 through the through-holes 30a. The encircling portion 30B may be provided in an annular shape in plan view.

A gas channel 34 is provided on the showerhead 30. According to one example, the showerhead 30 and the gas channel 34 may be welded together. A space 36 is provided between the gas channel 34 and the gas passing portion 30A. A gas introducing port 34a is provided at the center of the gas channel 34. Gas is supplied into the space 36 via the gas introducing port 34a.

According to one example, a material gas source 40, a carrier gas source 42, a reaction gas source 44 and a cleaning gas source 46 are prepared as gas sources. A precursor is stored in the material gas source 40. An example of the precursor stored in the material gas source 40 is DMDMOS (Dimethyldimethoxysilane). A precursor under liquid state is stored in the material gas source 40, and the vapor of the precursor is supplied to the chamber 10 with a carrier gas from the carrier gas source 42. The carrier gas is, for example, noble gas such as He or Ar. The reaction gas source 44 is filled with, for example, $O_2$ gas. The cleaning gas source 46 is filled with $NF_3$ or $C_2F_6$ as cleaning gas.

Gas supply or no gas supply to the chamber 10 from the material gas source 40, the carrier gas source 42, the reaction gas source 44 and the cleaning gas source 46, and gas flow rates thereof are adjusted by valves 50, 52, 54, and 56, respectively. Gas supplied into the chamber 10 is exhausted to the outside via, for example, an exhaust duct 16 provided between the chamber 10 and the showerhead 30. For example, a valve 18 and a pump 20 are attached to an exhaust pipe connected to the exhaust duct 16, and the opening degree of the valve 18 and the pumping ability of the pump 20 are adjusted, thereby enabling determination of the pressure inside the chamber 10.

Figure 2:
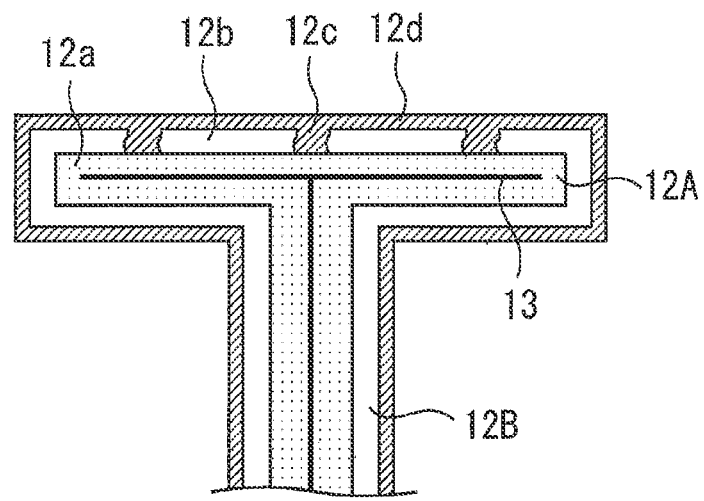
FIG. 2 is a cross-sectional view showing an example of the susceptor.

FIG. 2 is a cross-sectional view showing a configuration example of the susceptor 12. A base metal 12a is formed of aluminum or a material containing aluminum. The heater 13 may be provided inside the base metal 12a. The surface of the base metal 12a is covered by an anodized layer 12b. The anodized layer is, for example, a layer containing $AlO_2$. According to one example, the anodized layer 12b has cracks 12c. The base metal 12a formed of aluminum or the material containing aluminum expands at a high temperature, but the anodized layer 12b does not so expand at a high temperature. This difference in the degree of expansion may cause occurrence of the cracks 12c in the anodized layer 12b.

In the example of FIG. 2, a CF coating 12d covers the anodized layer 12b. Specifically, the CF coating 12d is filled in the cracks 12c, and also exists on the upper surface of the anodized layer 12b. The exposure of the base metal 12a is avoided by filling the cracks 12c with the CF coating 12d. The CF coating 12d is, for example, a fluorocarbon polymer.

Figure 3:
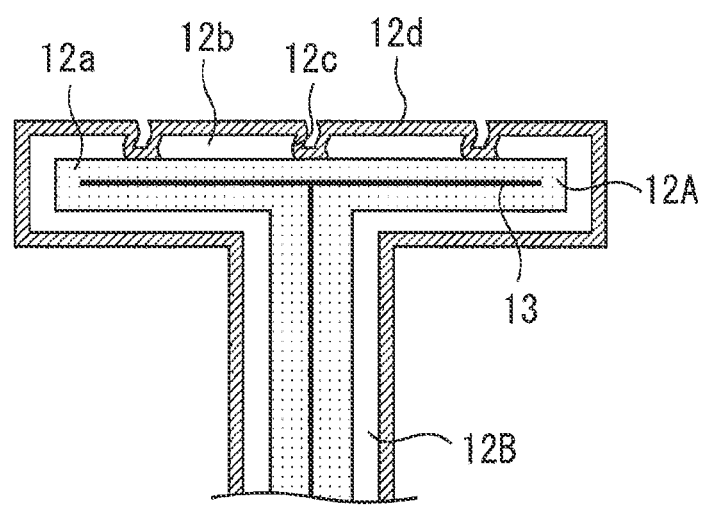
FIG. 3 is a cross-sectional view showing another example of the susceptor.

FIG. 3 is a cross-sectional view showing a configuration example of the susceptor according to another example. The CF coating 12d is provided on the inner walls of the cracks 12c and the upper surface of the anodized layer 12b without being filled in the cracks 12c. As a result, a minute irregular structure occurs on the surface of the susceptor. The exposure of the base metal 12a is avoided by forming the CF coating 12d on the inner walls of the cracks 12c.

Figure 4:
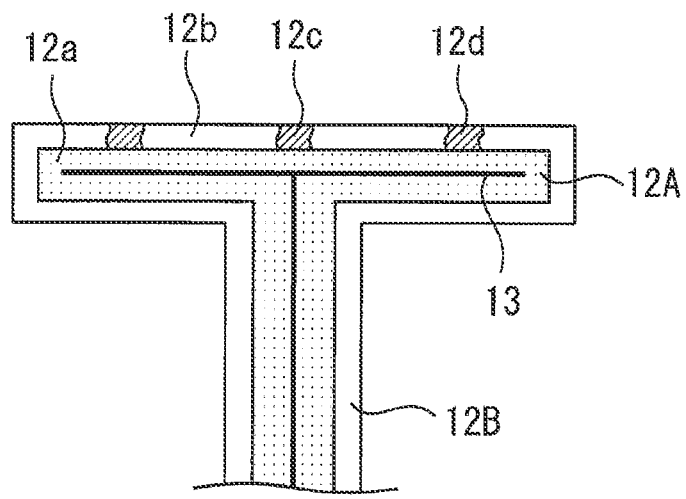
FIG. 4 is a cross-sectional view showing another example of the susceptor.

FIG. 4 is a cross-sectional view showing a configuration example of the susceptor according to another example. The CF coating 12d is filled in the crack 12c. The CF coating 12d is exclusively formed in the cracks 12c to avoid the exposure of the base metal 12a. In this case, the upper surface of the anodized layer 12b is exposed. Therefore, a substrate such as a silicon wafer can be directly placed on the anodized layer 12b.

Figure 5:
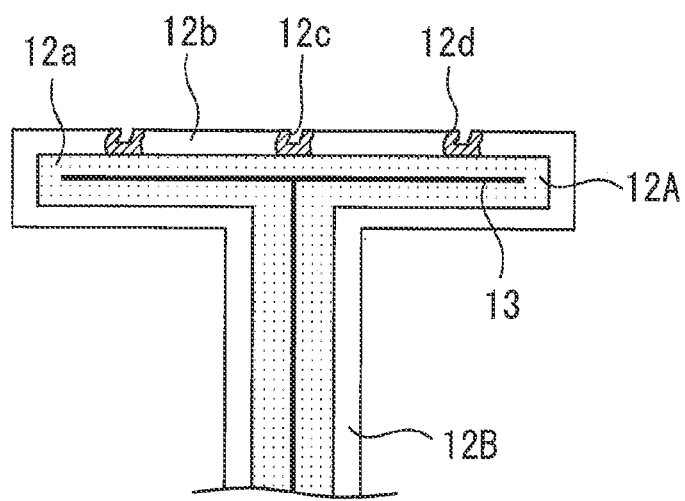
FIG. 5 is a cross-sectional view showing another example of the susceptor.

FIG. 5 is a cross-sectional view showing a configuration example of the susceptor according to another example. The CF coating 12d is provided on the inner walls of the cracks 12c without being filled in the cracks 12c to avoid the exposure of the base metal 12a. As a result, a minute irregular structure occurs on the surface of the susceptor. The upper surface of the anodized layer 12b is exposed. In this case, a substrate such as a silicon wafer can be directly placed on the anodized layer 12b.

Figure 6:
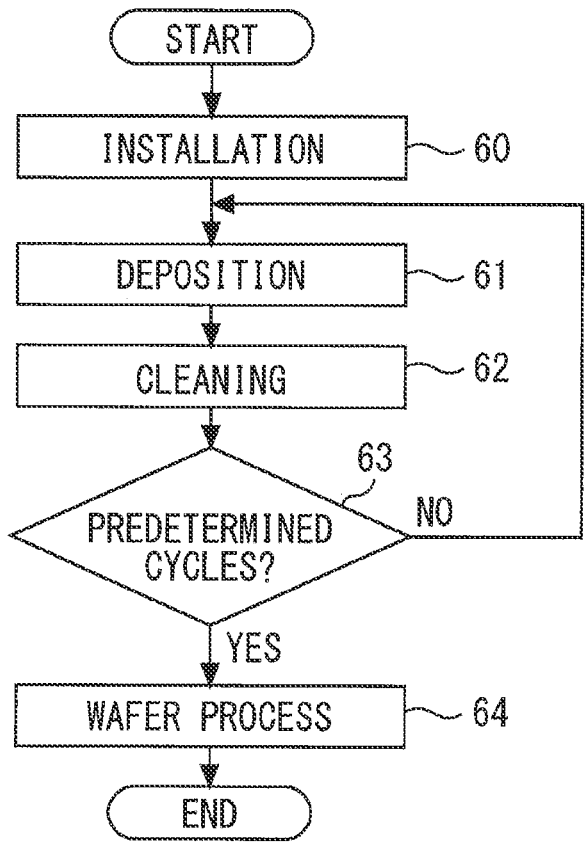
FIG. 6 is a flowchart showing an example of a susceptor coating method.
Figure 7:
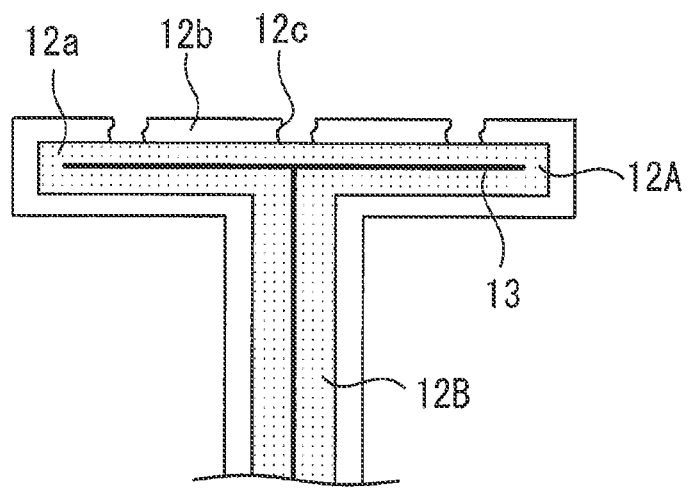
FIG. 7 is a cross-sectional view showing an example of the new susceptor.

FIG. 6 is a flowchart showing an example of a susceptor coating method. The CF coating is formed on an in-situ basis in the substrate processing apparatus of FIG. 1. First, in step 60, a new susceptor is attached to the substrate processing apparatus. FIG. 7 is a cross-sectional view showing a configuration example of the new susceptor. The susceptor of FIG. 7 includes a base metal 12a and an anodized layer 12b covering the surface of the base metal 12a, and no CF coating is formed. When this susceptor 12 is attached to the substrate processing apparatus, the susceptor 12 is positioned at a place shown in FIG. 1.

Figure 8:
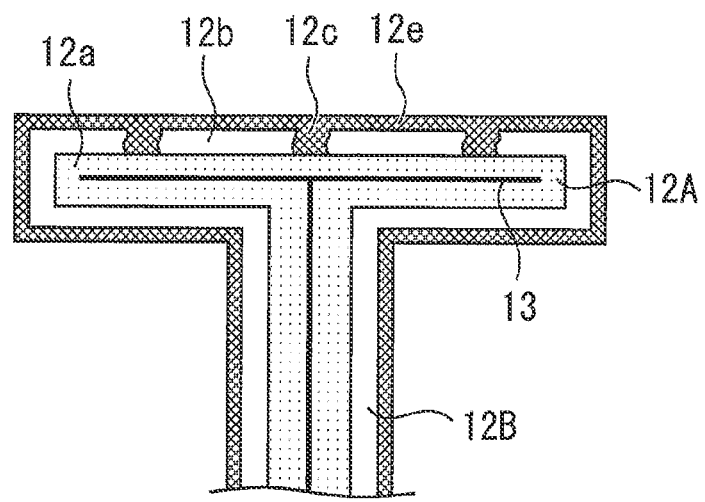
FIG. 8 shows an example of the formed initial layer.

Next, the processing proceeds to step 61. In step 61, an initial layer is formed in the susceptor by plasma using a precursor. FIG. 8 is a cross-sectional view of the susceptor which shows an example of the formed initial layer 12e. The plasma may be generated by applying high frequency power to the showerhead 30 while supplying gas from the material gas source 40 and the carrier gas source 42 to a space between the susceptor 12 and the showerhead 30.

An example of a processing condition for forming the initial layer 12e is described in a column of "Deposition" in FIG. 10. In this example, DMDMOS of 220 sccm as a precursor and carrier gas of 120 sccm are supplied into the substrate processing apparatus, and no oxygen gas is supplied. The precursor may be formed of another material containing C and F and containing no oxygen. In the formation of the initial layer, only the precursor and noble gas may be supplied into the substrate processing apparatus. In another example, another gas may be supplied additionally, but no oxygen gas is supplied. The pressure inside the chamber is set to 3.5 Torr, and the interval between the susceptor 12 and the showerhead 30 is set to, for example, 28 mm. Further, for example, the temperature of the susceptor is set to 400° C. by the heater 13, and high frequency power of 3000 W is applied to the showerhead 30. The initial layer 12e is a film containing a large amount of C.

Figure 9:
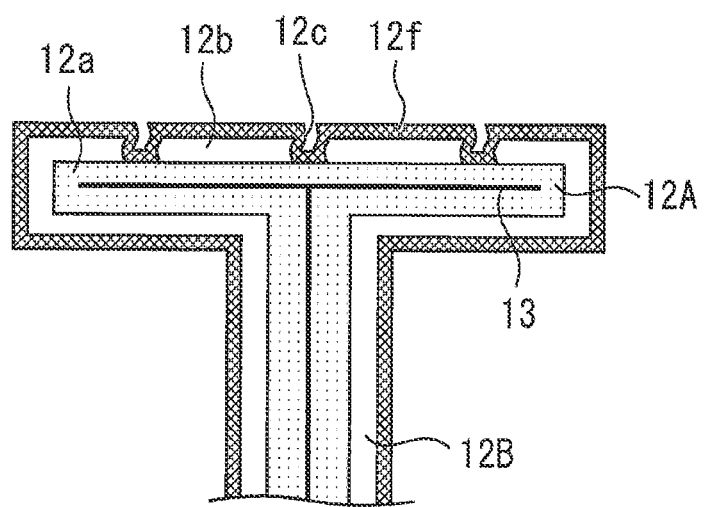
FIG. 9 shows an example of the formed CF coating.

Next, the processing proceeds to step 62. In step 62, the CF coating of polymer is formed by supplying the cleaning gas containing F to the initial layer 12e while heating the susceptor 12 to 350° C. or more. FIG. 9 is a cross-sectional view of the susceptor which shows an example of the formed CF coating 12f. $NF_3$ or $C_2F_6$ from the cleaning gas source 46 is supplied to a space between the susceptor 12 and the showerhead 30. An example of a processing condition for forming the CF coating 12f is described in a column of "Cleaning" in FIG. 10. In this example, the cleaning gas of 1.25 slpm and noble gas of 4.00 slpm are supplied into the chamber 10, and no oxygen gas is supplied.

The cleaning gas may be formed of another material containing F and containing no oxygen. In the formation of the CF coating, only the cleaning gas and the noble gas may be supplied into the substrate processing apparatus. In another example, another gas may be supplied additionally, but no oxygen gas is supplied. When oxygen gas is supplied in the formation of the initial layer and the formation of the CF coating, the formed CF coating is removed. Therefore, in this example, the formation of the initial layer and the formation of the CF coating are performed without supplying any oxygen.

The partial pressure ratio of the noble gas is shown in the column of "Noble gas partial pressure" of FIG. 10. The partial pressure ratio of the noble gas means the occupation ratio of the partial pressure of the noble gas to the total pressure of mixed gas. Accordingly, when the noble gas partial pressure is 76%, in this example, the partial pressure of the noble gas accounts for 76% of the total pressure. In the example of FIG. 10, it is shown that the cleaning gas and the noble gas are supplied in the formation of the CF coating, and the partial pressure ratio of the noble gas is set to 60% or more. When the partial pressure ratio of the noble gas is set to less than 60%, it will damage the anodized layer 12b. Therefore, the partial pressure ratio of the noble gas can be set to 60% or more.

On the other hand, when the partial pressure ratio of the noble gas is set to be excessively high, it is impossible to sufficiently supply F caused by the cleaning gas. When F is insufficiently supplied, a film containing much C and less F is formed. Therefore, the supply amount of F can be secured by setting the partial pressure ratio of the noble gas to 80% or less. Therefore, according to another example, the partial pressure ratio of the noble gas can be set to 60% or more and 80% or less. As described above, in the formation of the CF coating, the partial pressure ratio of the noble gas is set to 60% or more, thereby enabling suppression of damage to the anodized layer 12b, and also the partial pressure ratio of the noble gas is set to 80% or less, thereby enabling supply of a sufficient amount of F to be secured.

In FIG. 10, it is shown that the chamber pressure in the processing of "Cleaning" is set to 1.8 Torr. For example, the formation of the initial layer 12e described above is performed under the condition that the internal pressure of the substrate processing apparatus is set to 4 Torr or less, and the formation of the CF coating is performed under the condition that the internal pressure of the substrate processing apparatus is set to 2 Torr or less, which enables selective formation of the CF coating on the susceptor. That is, the CF coating can be intensively formed on the susceptor, and CF coating on parts around the susceptor can be suppressed.

Furthermore, the interval between the susceptor 12 and the showerhead 30 is set to 26 mm or more in the formation of the initial layer 12e described above, thereby enabling dense plasma to be generated on the susceptor 12 side, and enabling sparse plasma to be generated on the showerhead 30 side. In particular, the formation of the initial layer 12e is performed under the condition that the inter-electrode distance is set to 26 mm or more while the internal pressure of the substrate processing apparatus is set to 4 Torr or less, and the formation of the CF coating is performed under the condition that the internal pressure of the substrate processing apparatus is set to 2 Torr or less, thereby enabling selective CF coating on the susceptor. In this example, the film thickness of the CF coating formed on the susceptor 12 is larger than the film thickness of the CF coating formed on the showerhead 30 facing the susceptor 12

In the column of "Lower electrode temp" in the processing of "Cleaning" in FIG. 10, it is shown that the temperature of the susceptor is set to 400° C. in the formation of the CF coating. The formation of the initial layer 12e and the formation of the CF coating 12f can be performed under the condition that the temperature of the susceptor 12 is set to 350° C. or more and 400° C. or less. The formation of the initial layer 12e and the CF coating 12f at high temperatures of 350° C. or more enables the formation of the CF coating of polymer. The CF coating of polymer is a stable film which is not removed by, for example, oxygen plasma or the like. The forming process at the temperature of 350° C. or more enables the formation of robust CF coating of polymer. For example, the CF coating formed at a susceptor temperature of less than 350° C. becomes amorphous. Amorphous CF coating is easily peeled off.

Next, the processing proceeds to step 63. In step 63, it is determined whether or not the formation of the initial layer in step 61 and the formation of the CF coating in step 62 have been performed at a predetermined number of cycles. When the processing in steps 61 and 62 has not been performed at the predetermined number of cycles, the processing in these steps is performed again. The processing in steps 61 and 62 is performed, for example, at 1000 cycles or more. By performing the processing in steps 61 and 62 at the predetermined number of cycles, for example, the CF coating 12d in FIGS. 2 and 3 is formed.

By forming the CF coating through a series of processing as described above, it is possible to fill cracks occurring in the anodized layer 12b during or before the formation of the CF coating, and suppress exposure of the base metal 12a. That is, even when there is any crack in the anodized layer 12b, the exposure of the base metal 12a is suppressed by the CF coating 12d.

Next, the processing proceeds to step 64. Step 64 is a step of processing the substrate by using the susceptor 12 having the CF coating 12d formed thereon. The processing of the substrate is, for example, film formation on the substrate, modification of a film of the substrate, or etching of the film of the substrate, which is performed with plasma or without plasma. For example, after forming the CF coating 12d, the substrate is placed on the susceptor 12, and a plasma treatment is performed on the substrate. The substrate is, for example, a wafer made of a wide bandgap semiconductor such as silicon carbide or GaN, or a silicon wafer.

The CF coating may be applied to the susceptor again after the processing on the substrate is repeated for a plurality of times. For example, placement of the substrate on the susceptor 12 after the formation of the CF coating and execution of the plasma treatment on the substrate are performed for a plurality of times, and then the CF coating 12d is formed again by the method described above. As described above, the CF coating can be performed periodically in the intervals in the semiconductor process.

The invention claimed is:

1. A susceptor comprising:
a base metal formed of aluminum or a material containing aluminum;
an anodized layer covering a surface of the base metal and having cracks therein; and
a CF coating of polymer provided in the cracks,
wherein an upper surface of the anodized layer is exposed,
wherein the CF coating comprises a polymer formed of at least one monomer that contains F, and
wherein the CF coating is formed on inner walls of the cracks and does not completely fill the cracks.

2. The susceptor according to claim 1, wherein the anodized layer contains AlO2.

3. The susceptor according to claim 1, further comprising a heater provided inside the base metal.

4. The susceptor according to claim 1, wherein the CF coating comprises Dimethyldimethoxysilane (DMDMOS).

5. The susceptor according to claim 1, wherein the CF coating contacts the base metal, the CF coating prevent the base metal from being exposed.

6. A susceptor comprising:
a base metal formed of aluminum or a material containing aluminum;
an anodized layer covering a surface of the base metal and having cracks therein; and
a CF coating of polymer provided in the cracks,
wherein the CF coating comprises a polymer formed of at least one monomer that contains F, and
wherein the CF coating is filled in the cracks, and an upper surface of the anodized layer is exposed.

7. The susceptor according to claim 6, wherein an upper surface of the CF coating is flush with the upper surface of the anodized layer.

* * * * *